(12) United States Patent
Ke et al.

(10) Patent No.: US 12,426,515 B2
(45) Date of Patent: Sep. 23, 2025

(54) SEMICONDUCTOR DEVICE AND METHOD FOR FABRICATING THE SAME

(71) Applicant: UNITED MICROELECTRONICS CORP., Hsin-Chu (TW)

(72) Inventors: Hsiang-Wen Ke, Kaohsiung (TW); Wei-Chuan Tsai, Changhua County (TW); Yen-Tsai Yi, Tainan (TW); Jin-Yan Chiou, Tainan (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 543 days.

(21) Appl. No.: 17/533,146

(22) Filed: Nov. 23, 2021

(65) Prior Publication Data

US 2023/0125856 A1 Apr. 27, 2023

(30) Foreign Application Priority Data

Oct. 26, 2021 (CN) .......................... 202111245898.5

(51) Int. Cl.
| | | |
|---|---|---|
| *H10N 50/10* | (2023.01) | |
| *H10B 61/00* | (2023.01) | |
| *H10N 50/01* | (2023.01) | |
| *H10N 50/80* | (2023.01) | |
| *H10N 50/85* | (2023.01) | |

(52) U.S. Cl.
CPC ............. *H10N 50/10* (2023.02); *H10B 61/22* (2023.02); *H10N 50/01* (2023.02); *H10N 50/80* (2023.02); *H10N 50/85* (2023.02)

(58) Field of Classification Search
CPC ........ H10N 50/01; H10N 50/10; H10N 50/80; H10N 50/85; H10B 61/22
USPC .......................................................... 257/421
See application file for complete search history.

(56) References Cited

U.S. PATENT DOCUMENTS

| | | | |
|---|---|---|---|
| 6,306,743 B1 * | 10/2001 | Lee ................... | H01L 21/28247 |
| | | | 438/653 |
| 6,309,966 B1 | 10/2001 | Govindarajan et al. | |
| 2003/0123216 A1 * | 7/2003 | Yoon ....................... | H01L 28/84 |
| | | | 257/E21.018 |
| 2013/0127058 A1 * | 5/2013 | Lavoie ............. | H01L 23/53261 |
| | | | 257/E21.585 |
| 2016/0043136 A1 * | 2/2016 | Kim ....................... | H01L 23/535 |
| | | | 257/295 |
| 2017/0213762 A1 * | 7/2017 | Gouk ................... | C23C 18/1653 |
| 2020/0013949 A1 * | 1/2020 | Feng ...................... | H10N 50/01 |

FOREIGN PATENT DOCUMENTS

CN 104157562 A * 11/2014 ....... H01L 21/02697

* cited by examiner

*Primary Examiner* — Fazli Erdem
(74) *Attorney, Agent, or Firm* — Winston Hsu

(57) ABSTRACT

A method for fabricating a semiconductor device includes the steps of forming an inter-metal dielectric (IMD) layer on a substrate, forming a trench in the IMD layer, forming a barrier layer in the trench, forming a nucleation layer on the barrier layer, performing an anneal process to form a silicide layer, forming a bulk layer on the silicide layer, and forming a magnetic tunneling junction (MTJ) on the bulk layer.

11 Claims, 3 Drawing Sheets

SEMICONDUCTOR DEVICE AND METHOD FOR FABRICATING THE SAME

BACKGROUND OF THE INVENTION

1. Field of the Invention

The invention relates to a semiconductor device and method for fabricating the same, and more particularly to a magnetoresistive random access memory (MRAM) and method for fabricating the same.

2. Description of the Prior Art

Magnetoresistance (MR) effect has been known as a kind of effect caused by altering the resistance of a material through variation of outside magnetic field. The physical definition of such effect is defined as a variation in resistance obtained by dividing a difference in resistance under no magnetic interference by the original resistance. Currently, MR effect has been successfully utilized in production of hard disks thereby having important commercial values. Moreover, the characterization of utilizing GMR materials to generate different resistance under different magnetized states could also be used to fabricate MRAM devices, which typically has the advantage of keeping stored data even when the device is not connected to an electrical source.

The aforementioned MR effect has also been used in magnetic field sensor areas including but not limited to for example electronic compass components used in global positioning system (GPS) of cellular phones for providing information regarding moving location to users. Currently, various magnetic field sensor technologies such as anisotropic magnetoresistance (AMR) sensors, GMR sensors, magnetic tunneling junction (MTJ) sensors have been widely developed in the market. Nevertheless, most of these products still pose numerous shortcomings such as high chip area, high cost, high power consumption, limited sensibility, and easily affected by temperature variation and how to come up with an improved device to resolve these issues has become an important task in this field.

SUMMARY OF THE INVENTION

According to an embodiment of the present invention, a method for fabricating a semiconductor device includes the steps of forming an inter-metal dielectric (IMD) layer on a substrate, forming a trench in the IMD layer, forming a barrier layer in the trench, forming a nucleation layer on the barrier layer, performing an anneal process to form a silicide layer, forming a bulk layer on the silicide layer, and forming a magnetic tunneling junction (MTJ) on the bulk layer.

According to another aspect of the present invention, a semiconductor device includes an inter-metal dielectric (IMD) layer on a substrate, a metal interconnection in the IMD layer, and a magnetic tunneling junction (MTJ) on the metal interconnection. Preferably, the metal interconnection includes a barrier layer, a silicide layer on the barrier layer, a nucleation layer on the silicide layer, and a bulk layer on the nucleation layer.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
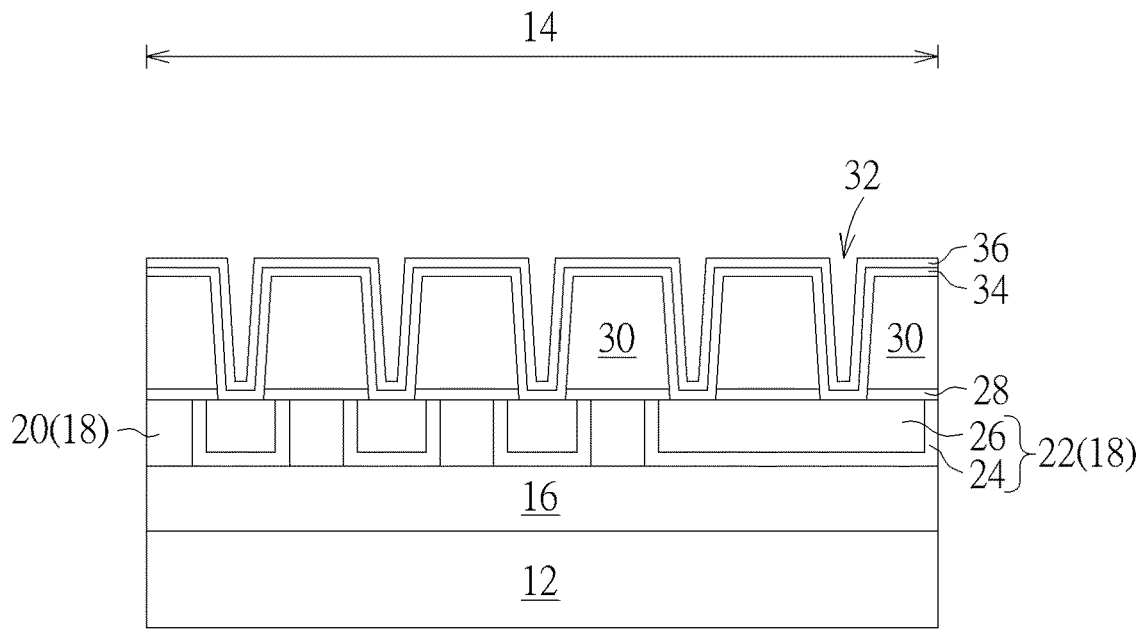
FIGS. 1-6 illustrate a method for fabricating a MRAM device according to an embodiment of the present invention.

Referring to FIGS. 1-6, FIGS. 1-6 illustrate a method for fabricating a semiconductor device, or more specifically a MRAM device according to an embodiment of the present invention. As shown in FIG. 1, a substrate 12 made of semiconductor material is first provided, in which the semiconductor material could be selected from the group consisting of silicon (Si), germanium (Ge), Si—Ge compounds, silicon carbide (SiC), and gallium arsenide (GaAs), and a MRAM region 14 and a logic region (not shown) are defined on the substrate 12.

Active devices such as metal-oxide semiconductor (MOS) transistors, passive devices, conductive layers, and interlayer dielectric (ILD) layer 16 could also be formed on top of the substrate 12. More specifically, planar MOS transistors or non-planar (such as FinFETs) MOS transistors could be formed on the substrate 12, in which the MOS transistors could include transistor elements such as gate structures (for example metal gates) and source/drain region, spacer, epitaxial layer, and contact etch stop layer (CESL). The ILD layer 16 could be formed on the substrate 12 to cover the MOS transistors, and a plurality of contact plugs could be formed in the ILD layer 16 to electrically connect to the gate structure and/or source/drain region of MOS transistors. Since the fabrication of planar or non-planar transistors and ILD layer is well known to those skilled in the art, the details of which are not explained herein for the sake of brevity.

Next, a metal interconnect structure 18 is formed on the ILD layer 16 to electrically connect the aforementioned contact plugs, in which the metal interconnect structure 18 includes an inter-metal dielectric (IMD) layer 20 and at least a metal interconnection 22 embedded in the IMD layer 20. In this embodiment, the metal interconnection 22 from the metal interconnect structure 18 preferably includes a trench conductor and each of the metal interconnections 22 from the metal interconnect structure 18 could be embedded within the IMD layers 20 according to a single damascene process or dual damascene process. For instance, each of the metal interconnections 22 could further include a barrier layer 24 and a metal layer 26, in which the barrier layer 24 could be selected from the group consisting of titanium (Ti), titanium nitride (TiN), tantalum (Ta), and tantalum nitride (TaN) and the metal layer 26 could be selected from the group consisting of tungsten (W), copper (Cu), aluminum (Al), titanium aluminide (TiAl), and cobalt tungsten phosphide (CoWP). Since single damascene process and dual damascene process are well known to those skilled in the art, the details of which are not explained herein for the sake of brevity. In this embodiment, the metal layer 26 in the metal interconnection 22 is preferably made of copper and the IMD layer 20 is preferably made of silicon oxide or ultra low-k (ULK) dielectric layer, but not limited thereto.

Next, a stop layer 28 and another IMD layer 30 are formed on the IMD layer 20, and a photo-etching process is conducted to remove part of the IMD layer 30 to form at least a trench 32 in the IMD layer 30. Next, a barrier layer 34 and a nucleation layer 36 are formed in the trenches 32 without filling the trenches 32 completely. In this embodiment, the barrier layer 34 preferably includes titanium (Ti), titanium nitride (TiN), or combination thereof and the nucleation layer 36 preferably includes tungsten (W). In this embodiment, if the barrier layer 34 were made of a dual-layer composite structure made of Ti and TiN, the bottom layer of the barrier layer 34 preferably includes Ti while the top layer of the barrier layer 34 preferably includes TiN. The nucleation layer 36 is preferably formed by a chemical vapor deposition (CVD) process through reacting gases such as tungsten fluoride ($WF_6$) and silane ($SiH_4$).

Figure 2:
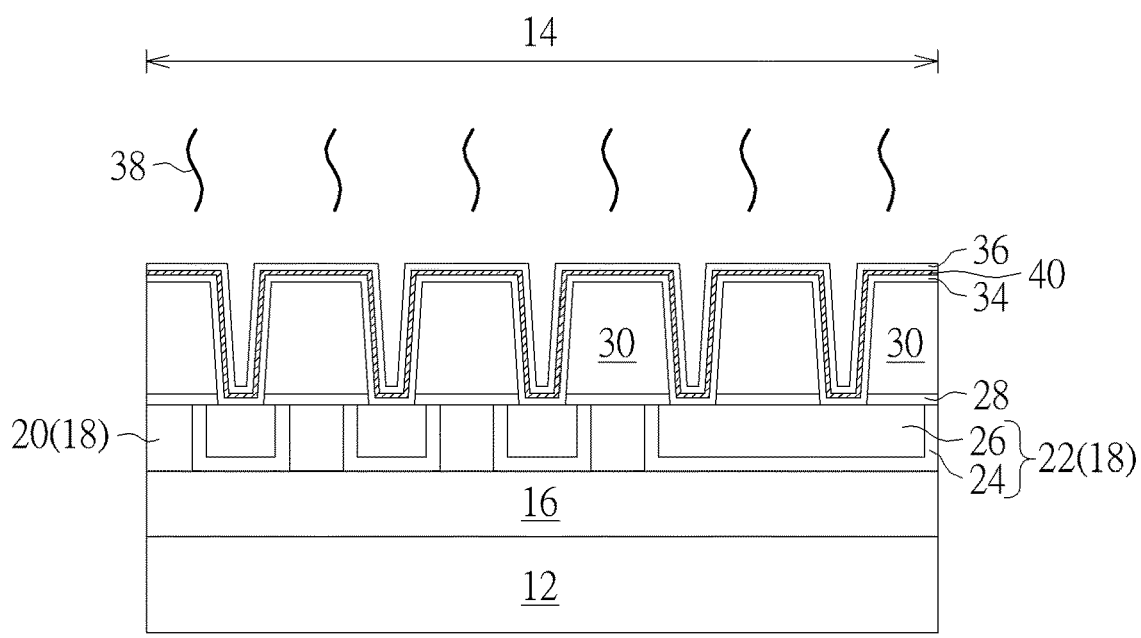

Next, as shown in FIG. 2, an anneal process 38 is conducted to crystallize the nucleation layer 36 made of W for forming a silicide layer 40, in which the silicide layer 40 preferably includes tungsten silicide. In this embodiment, the temperature of the anneal process 38 is preferably between 600-700° C. or most preferably at around 650° C. and the duration of the anneal process 38 is between 20 seconds to 20 minutes. It should be noted that as the anneal process 38 is conducted to form the silicide layer 40 at this stage, only part of the nucleation layer 36 is crystallized to form the silicide layer 40 so that after the silicide layer 40 is formed, part of the remaining or un-reacted nucleation layer 36 is still disposed on the top surface of the silicide layer 40. It should further be noted that even though the nucleation layer 36 preferably not reacting with the barrier layer 34, according to other embodiment of the present invention, part of the nucleation layer 36 could still react with part of the barrier layer 34 to form compounds such as tungsten nitride (WN). Structurally, even though the overall thickness of the nucleation layer 36 could be slightly reduced from FIG. 1 to FIG. 2 while the thickness of the barrier layer 34 remains unchanged from FIG. 1 to FIG. 2, according to other embodiment of the present invention if part of the barrier layer 34 is reacted during the anneal process 38, the overall thickness of the barrier layer 34 could also be reduced slightly from FIG. 1 to FIG. 2, which is also within the scope of the present invention.

Figure 3:
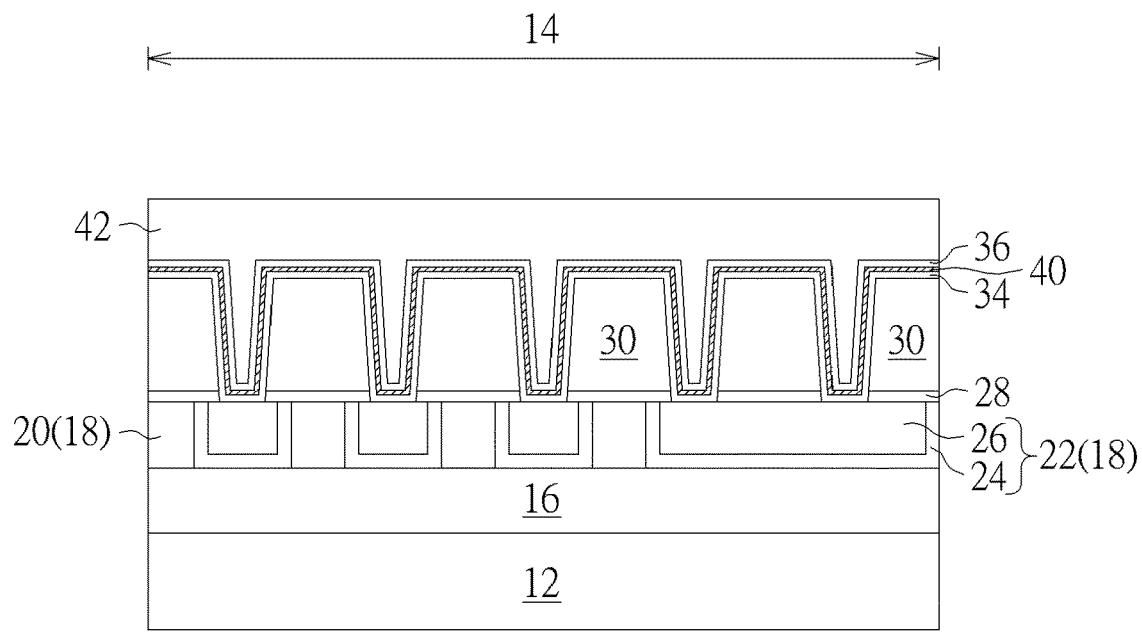

Next, as shown in FIG. 3, a bulk layer 42 is formed on the surface of the nucleation layer 36 to fill the trenches 32 completely. Preferably, the bulk layer 42 and the nucleation layer 36 are made of same material such as tungsten (W).

Figure 4:
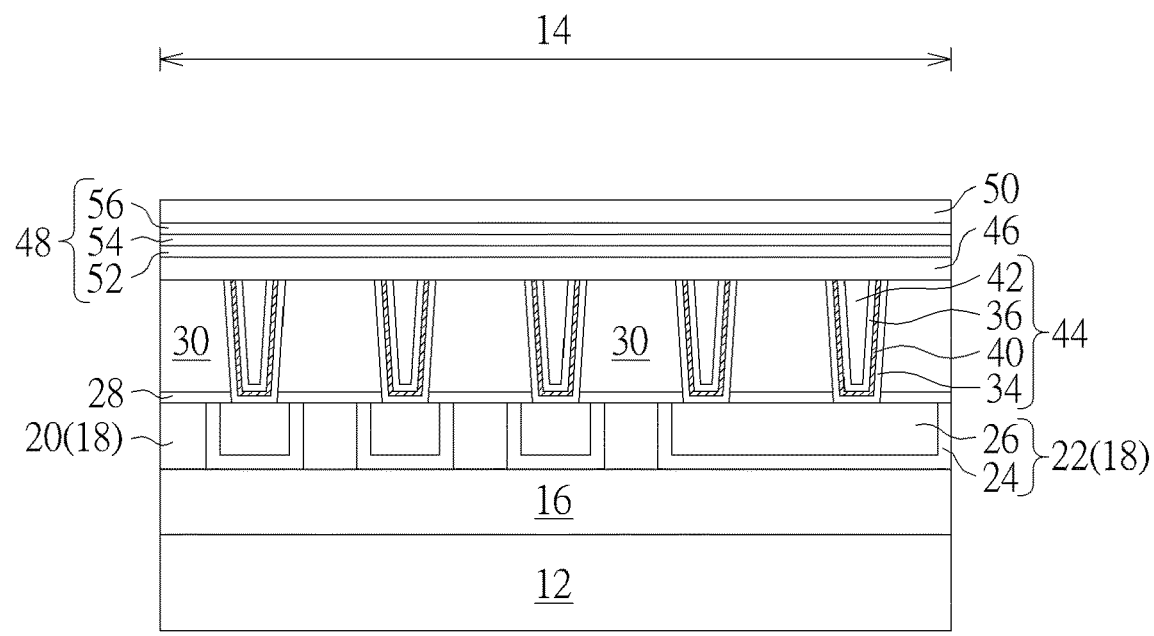

Next, as shown in FIG. 4, a planarizing process such as chemical mechanical polishing (CMP) process is conducted to remove part of the bulk layer 42, part of the nucleation layer 36, part of the silicide layer 40, and part of the barrier layer 34 so that the top surface of the remaining barrier layer 34, silicide layer 40, nucleation layer 36, and bulk layer 42 is even with the top surface of the IMD layer 30 for forming a metal interconnection 44 in each of the trenches 32.

Next, a bottom electrode 46, a MTJ stack 48 or stack structure, a top electrode 50, and a patterned mask (not shown) are formed on the metal interconnect structure 18. In this embodiment, the formation of the MTJ stack 48 could be accomplished by sequentially depositing a pinned layer 52, a barrier layer 54, and a free layer 56 on the bottom electrode 46. In this embodiment, the bottom electrode layer 46 and the top electrode layer 50 are preferably made of conductive material including but not limited to for example Ta, Pt, Cu, Au, Al, or combination thereof. The pinned layer 52 could be made of ferromagnetic material including but not limited to for example iron, cobalt, nickel, or alloys thereof such as cobalt-iron-boron (CoFeB) or cobalt-iron (CoFe). Alternatively, the pinned layer 52 could also be made of antiferromagnetic (AFM) material including but not limited to for example ferromanganese (FeMn), platinum manganese (PtMn), iridium manganese (IrMn), nickel oxide (NiO), or combination thereof, in which the pinned layer 52 is formed to fix or limit the direction of magnetic moment of adjacent layers. The barrier layer 54 could be made of insulating material including but not limited to for example oxides such as aluminum oxide ($AlO_x$) or magnesium oxide (MgO). The free layer 56 could be made of ferromagnetic material including but not limited to for example iron, cobalt, nickel, or alloys thereof such as cobalt-iron-boron (CoFeB), in which the magnetized direction of the free layer 56 could be altered freely depending on the influence of outside magnetic field.

Figure 5:
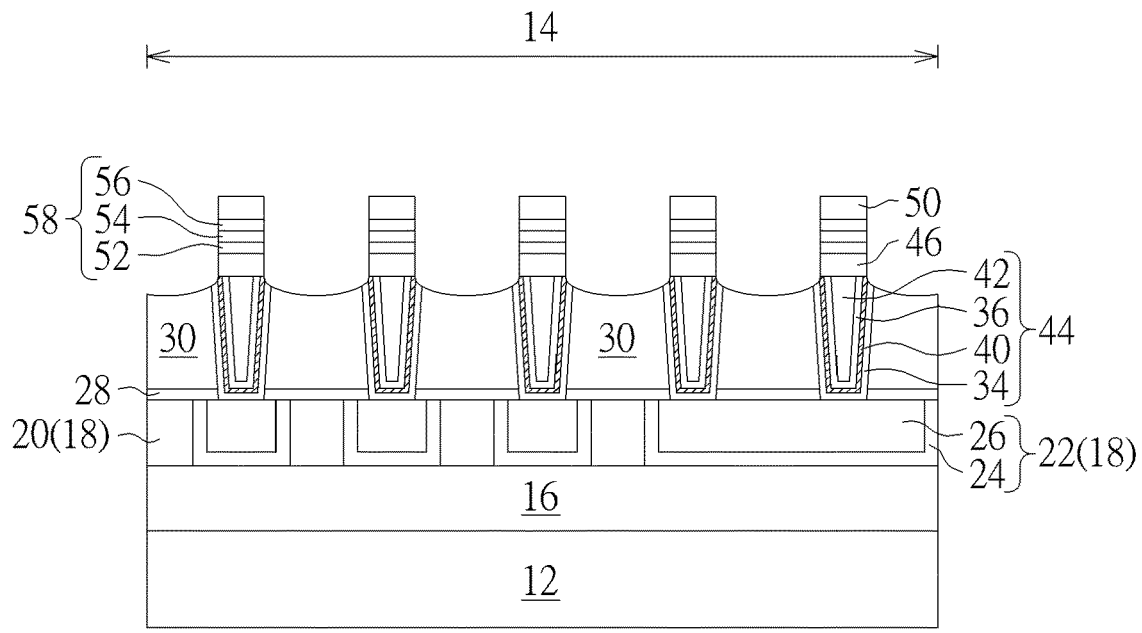

Next, as shown in FIG. 5, one or more etching process is conducted by using the patterned mask as mask to remove part of the top electrode 50, part of the MTJ stack 48, part of the bottom electrode 46, and part of the IMD layer 30 to form MTJs 58 on the MRAM region 14. It should be noted that a reactive ion etching (RIE) and/or an ion beam etching (IBE) process is conducted to remove the top electrode 50, MTJ stack 48, bottom electrode 46, and the IMD layer 30 in this embodiment for forming the MTJs 58. Due to the characteristics of the IBE process, the top surface of the remaining IMD layer 30 is slightly lower than the top surface of the metal interconnections 44 after the IBE process and the top surface of the IMD layer 30 also reveals a curve or an arc. It should also be noted that as the IBE process is conducted to remove part of the IMD layer 30, part of the metal interconnection 44 is removed at the same time to form inclined sidewalls or curves on the surface of the metal interconnection 44 immediately adjacent to the MTJs 58.

Figure 6:
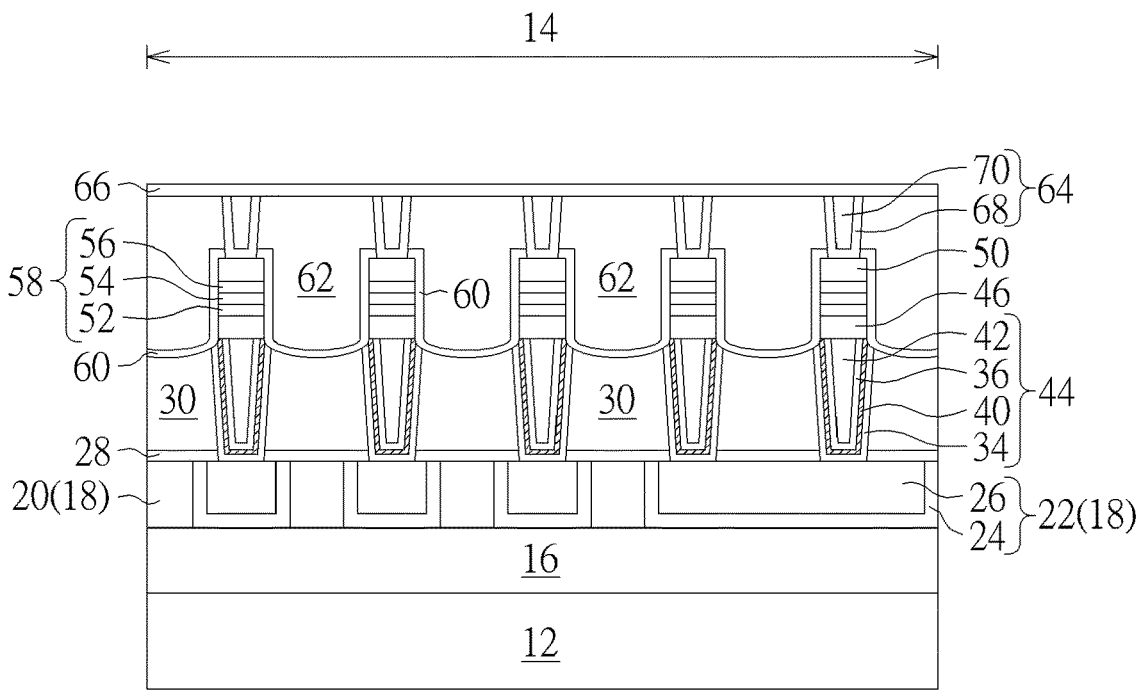

Next, as shown in FIG. 6, a cap layer 60 is formed on the MTJs 58 to cover the surface of the IMD layer 30, an IMD layer 62 is formed on the cap layer 60, and one or more photo-etching process is conducted to remove part of the IMD layer 62 and part of the cap layer 60 to form contact holes (not shown) exposing the top electrodes 50. Next, conductive materials are deposited into the contact holes and planarizing process such as CMP is conducted to form metal interconnections 64 connecting the top electrodes 50 underneath. Next, another stop layer 66 is formed on the IMD layer 62 and covering the metal interconnections 64.

In this embodiment, the cap layer 60 preferably includes silicon nitride, but could also include other dielectric material including but not limited to for example silicon oxide, silicon oxynitride (SiON), or SiCN depending on the demand of the product. The stop layer 66 could include nitrogen doped carbide (NDC), silicon nitride, silicon carbon nitride (SiCN), and most preferably SiCN. Similar to the aforementioned metal interconnections 22, the metal interconnections 64 could be formed in the IMD layer 62 according to a single damascene process or dual damascene process. For instance, each of the metal interconnections 64 could further include a barrier layer 68 and a metal layer 70, in which the barrier layer 68 could be selected from the group consisting of titanium (Ti), titanium nitride (TiN), tantalum (Ta), and tantalum nitride (TaN) and the metal layer 70 could be selected from the group consisting of tungsten (W), copper (Cu), aluminum (Al), titanium aluminide (TiAl), and cobalt tungsten phosphide (CoWP). This completes the fabrication of a semiconductor device according to an embodiment of the present invention.

Referring again to FIG. 6, FIG. 6 further illustrates a structural view of a MRAM device according to an embodiment of the present invention. As shown in FIG. 6, the MRAM device includes an IMD layer 30 disposed on the substrate 12, metal interconnections 44 embedded in the IMD layer 30, MTJs 58 disposed on the metal interconnections 44, and metal interconnections 64 directly contacting the top electrodes 58 atop the MTJs 58. In this embodiment, each of the metal interconnections 44 directly under the MTJ 58 includes a barrier layer 34, a silicide layer 40 disposed on the barrier layer 34, a nucleation layer 36 disposed on the silicide layer 40, and a bulk layer 42 disposed on the nucleation layer 36. The metal interconnection 64 directly on top of each of the MTJs 58 on the other hand only includes a barrier layer 58 and a metal layer 70.

Preferably, the nucleation layer 36 and the bulk layer 42 are made of same material such as tungsten (W) and the silicide layer 40 is made of tungsten silicide. By conducting an anneal process to form a silicide layer between barrier layer and nucleation layer in the metal interconnection 44 directly under MTJ, it would be desirable to lower overall resistance of the device and improve performance of the device significantly.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for fabricating a semiconductor device, comprising:
    forming an inter-metal dielectric (IMD) layer on a substrate;
    forming a trench in the IMD layer;
    forming a barrier layer in the trench;
    forming a nucleation layer on the barrier layer;
    performing an anneal process to crystallize a part of the nucleation layer for forming a silicide layer without enabling the nucleation layer to react with the barrier layer disposed thereunder, wherein the barrier layer, the silicide layer and another part of the nucleation layer are sequentially distributed in the trench;
    forming a bulk layer on the silicide layer; and
    forming a magnetic tunneling junction (MTJ) on the bulk layer.

2. The method of claim 1, further comprising:
    planarizing the bulk layer, the silicide layer, and the barrier layer to form a metal interconnection in the IMD layer; and
    forming the MTJ on the metal interconnection.

3. The method of claim 1, wherein a temperature of the anneal process is between 600-700° C.

4. The method of claim 1, wherein a duration of the anneal process is between 20 seconds to 20 minutes.

5. The method of claim 1, wherein the nucleation layer and the bulk layer comprises same material.

6. The method of claim 1, wherein the nucleation layer comprises tungsten (W).

7. The method of claim 1, wherein the bulk layer comprises tungsten (W).

8. A semiconductor device, comprising:
    an inter-metal dielectric (IMD) layer on a substrate;
    a metal interconnection in a trench of the IMD layer, wherein the metal interconnection comprises:
        a barrier layer;
        a silicide layer on top of the barrier layer;
        a nucleation layer on the silicide layer; and
        a bulk layer on the nucleation layer,
    wherein the silicide layer is spaced from the substrate by the barrier layer; and
    a magnetic tunneling junction (MTJ) on the metal interconnection.

9. The semiconductor device of claim 8, wherein the nucleation layer and the bulk layer comprises same material.

10. The semiconductor device of claim 8, wherein the nucleation layer comprises tungsten (W).

11. The semiconductor device of claim 8, wherein the bulk layer comprises tungsten (W).

* * * * *